United States Patent

Ando et al.

Patent Number: 5,853,108
Date of Patent: Dec. 29, 1998

[54] PARTS FEED APPARATUS AND PARTS FEED METHOD

[75] Inventors: Takashi Ando, Koufu; Yoshihisa Tachiyama, Yamanashi-ken; Yoshimi Ohara, Yamanashi-ken; Tsukasa Tanihara, Yamanashi-ken; Akio Yamagami, Koufu; Kazuyuki Nakano, Yamanashi-ken; Shigeki Imafuku, Nirasaki, all of Japan

[73] Assignee: Matsushita Electric Industrial Co., Ltd., Japan

[21] Appl. No.: 698,736

[22] Filed: Aug. 16, 1996

[30] Foreign Application Priority Data

Aug. 21, 1995 [JP] Japan .................................. 7-212088
Nov. 6, 1995 [JP] Japan .................................. 7-286967

[51] Int. Cl.⁶ ...................................................... B23Q 7/12
[52] U.S. Cl. .......................... 221/163; 221/112; 221/185; 221/200; 221/211; 221/278; 406/137; 414/755
[58] Field of Search ..................................... 221/112, 171, 221/160, 163, 166, 92, 185, 200, 202, 236, 211, 278, 197; 406/137; 414/755

[56] References Cited

U.S. PATENT DOCUMENTS

| | | | |
|---|---|---|---|
| 2,384,738 | 9/1945 | Harvey | 221/163 |
| 4,401,234 | 8/1983 | Droira et al. | 221/92 |
| 4,801,044 | 1/1989 | Kubota et al. | 221/163 |
| 5,143,253 | 9/1992 | Takahashi et al. | 221/197 |
| 5,160,066 | 11/1992 | Hamuro et al. | 221/171 |
| 5,570,812 | 11/1996 | Ando et al. | 221/211 |
| 5,582,493 | 12/1996 | Hineno | 406/137 |

FOREIGN PATENT DOCUMENTS

| | | |
|---|---|---|
| 0136634 | 4/1985 | European Pat. Off. ............... 221/278 |
| 452 038 | 10/1991 | European Pat. Off. . |
| 3717918 | 12/1987 | Germany . |
| 07086795 | 3/1995 | Japan . |
| 482 610 | 12/1969 | Switzerland . |

Primary Examiner—H. Grant Skaggs
Attorney, Agent, or Firm—Parkhurst & Wendel, L.L.P.

[57] ABSTRACT

When feeding parts (102) to a mounting machine (A) by using a parts feed cassette (B), prior to parts feed, air is preliminarily supplied to the parts feed cassette (B) to put the parts (102) in neat order, and the parts (102) are preliminarily sent up to a final position in a parts feed route (113). Accordingly, if the parts (102) cannot be securely sent up to the parts feed position (114) in the parts feed route (113) by supplying air (1b) only for a specific limited time for feeding parts (102), the parts (102) can be preliminarily sent forward in neat order, and by the supply of air (1b) for parts feed, the parts (102) can be fed quickly, securely, and stably.

20 Claims, 13 Drawing Sheets

FIG.10

NC PROGRAM

| NO. | X | Y | Z | ............ |
|---|---|---|---|---|
| 1 | 0 | 0 | 1 | |
| 2 | 100 | 0 | 2 | |
| 3 | 200 | 0 | 1 | |
| 4 | 300 | 0 | 2 | |
| | | ⋮ | | |

Z TABLE MOVES LEFT
Z TABLE MOVES RIGHT

PARTS FEED APPARATUS AND PARTS FEED METHOD

FIELD OF THE INVENTION

The present invention relates to a parts feed apparatus and a parts feed method usable in various applications, for example, relating to a parts feed apparatus and a parts feed method for sending out various parts such as small electronic parts to be mounted on an electronic circuit board to a parts feed route while agitating them by air, sending the parts up to a parts feed position in the parts feed route by air while arranging them in neat order, and feeding the parts to a mounting machine for mounting them on the electronic circuit board.

BACKGROUND OF THE INVENTION

When mounting electronic parts on an electronic circuit board, it is required to feed multiple electronic parts at high speed.

Accordingly, hitherto, as a method of feeding electronic parts, in particular, multiple small electronic parts at high speed, so-called taped parts were known, that is, a covering tape is glued to an accommodating tape accommodating parts in multiple parts accommodating units arranged in one direction and opened at one side. The taped parts are sent out at specific pitches, and the covering tape is peeled off at parts feed positions, and parts accommodating units are opened, and the accommodated parts are taken out by suction nozzle or the like, and used.

As an alternative simplified method, a parts feed apparatus using a parts feed cassette is known, in which various small electronic parts are sent out to a parts feed route while agitating by air, arranged in a row, and sent up to parts feed positions in the parts feed route by air.

FIG. 1 is a partial sectional view of a parts feed cassette, and FIG. 14 is a perspective view of a mounting machine having a parts feed cassette. A mounting machine A is designed to mount electronic parts 102 on a printed board 101. Parts feed cassettes B are installed on a parts feed table (moving table) 103 arranged at the side of the mounting machine 1, as many as the number of types of electronic parts 102 required in the mounting machine A. This parts feed cassette B holds a required type of electronic parts 101 on every occasion, and moves to a position confronting the mounting machine A.

The mounting machine A sucks the electronic parts 102 supplied from the parts feed cassette B by a suction nozzle 105 provided in a parts suction head 104, and mounts them on the printed board 101. The printed board 101 is put on an XY table 106 movable in two mutually orthogonal X and Y directions, and moves in X and Y directions. On this printed board 101, the electronic parts 102 sucked by the suction nozzle 105 and carried up to the mounting positions are mounted.

The parts feed cassette B is replenished with parts 102 from a bulk cassette 112 detachably fitted to the rear part of an agitating chamber 111. In the agitating chamber 111, parts are agitated by supply of air, and the parts are sent into a parts feed route 113 next to the agitating chamber 111. The parts feed route 113 sends the parts 102 up to a parts.feed position 114 by air while arranging in neat order, and the parts 102 are supplied into the mounting machine A.

The parts feed route 113 is opened upward in the parts feed position, so that the arriving parts 102 may be taken out. In this opening, a shutter 115 is provided. When the mounting machine A picks up the parts 102 by suction nozzle 105 or the like, by pushing down the lever 117 of the parts feed cassette B by a pusher 116, the shutter 115 is opened, and the parts 102 sent up to the parts feed position are picked up by the suction nozzle 105 or the like.

Incidentally, the parts 102 are agitated by air in the agitating chamber 111, and sent out into a narrow parts feed route 113, and is arranged in one row in a specific direction. However, since the parts feed route 113 is narrow, the sending probability of parts 102 into the parts feed route 113 is low. If this probability is low, it cannot be applied in the recent mounting machine A in which high speed is demanded.

Conventionally, therefore, air was blown out from plural positions before and after the bottom of the agitating chamber 111, and the parts were blown up backward slightly obliquely to encourage agitation of parts 102, and while preventing clogging of the parts 102, the parts 102 were arranged in specified direction, and the probability of sending out to the parts feed route 113 was improved.

In the parts feed route 113, air was blow out obliquely forward from plural positions in the bottom, and the parts 102 being sent out to the parts feed route 113 were sent out in a row up to the parts feed position 114 without trouble.

However, the air blowing-up manner into the agitating chamber 111 was not satisfactory, and parts 102 remained stagnant near the opening of the narrow parts feed route 113, and sending of parts 102 to the parts feed route 113 was disturbed, or jamming of parts 102 occurred due to defective sending.

Or, due to curvature of the parts feed route 113 or depending on degree of allowance between the parts 102 and route 113, the parts 102 may not be always sent to the parts feed position at sufficient speed and probability. If parts may be fed at high speed, sending may be insufficient or defective.

If the parts are securely sent up to the parts feed position, since the parts feed route is opened upward at this position, the posture and position of the parts may not be constant due to air sending, and they may not be sucked securely by the suction nozzle or jamming may be caused. Or suction by suction nozzle may be applied up to next component 102 and double suction may occur, and the arrangement of the succeeding parts 102 may be disturbed.

It means problems in stable and rapid feed of parts, and it cannot cope with the higher speed trend of mounting of parts.

Besides, at the time of replacement of the bulk cassette 112 at the end of parts or replacement of the parts feed cassette B due to production model changeover, very often, the parts feed cassette B has not supplied parts at all yet.

It, however, requires an extra time for the parts 102 to be arranged in the parts feed route 113 and sent up to the parts feed position 114. Accordingly, if air is supplied for feeding parts after the parts feed cassette B comes to the position for feeding part to the mounting machine A before the parts are not arranged in the parts feed route 113, it takes too much time, and the operation cycle of the mounting machine A may be disturbed, which impedes the high speed operation.

Certain mounting machines A judge shortage of parts if failing to suck the parts 102 for a specific number of times. Actually, only the arrival of parts is delayed, but it is judged as shortage of parts, and the stopping for replenishing parts and replenishing actions are wasteful, which is a problem. Moreover, the delay in arrival of parts or defects may also occur when the air pressure is insufficient for the type, size or shape of the parts.

The parts feed cassettes B are arranged in a plurality on a moving table 103 as shown in FIG. 3, move to the production position E confronting the mounting machine A, and supplies necessary parts on every occasion. This is the so-called parts leading action.

However, the parts feed route 113 of the parts feed cassette B is, as shown in FIG. 1, extended forward from the agitating chamber 111 in the rear part, and at the leading end, as shown in FIG. 2 (a), the parts feed position 114 is directed at right angle to the longitudinal direction of the parts feed cassette B.

Accordingly, for parts leading action, when the parts feed cassette B is moved in the direction of arrow C shown in FIG. 2 (a), the parts 102 once sent up to the parts feed position 114 of the parts feed route 113 may be slightly moved back from the parts feed position 114 by the inertia at the time of move of the parts feed cassette B. It may also cause problems of delay in parts feed or defects.

DISCLOSURE OF THE INVENTION

The invention is intended to solve such problems of the prior art, and it is hence a primary object thereof to present a parts feed apparatus and a parts feed method capable of feeding parts quickly, securely, and stably.

To achieve such primary object, the invention comprises an agitating chamber for agitating parts by air, a parts feed route connected to the agitating chamber for receiving agitated parts in specific direction, arranging them in neat order, and sending up to a specific parts feed position by air, air supply means for supplying air to the agitating chamber and parts feed route, and control means for controlling the air supply means so that the air may be supplied before and after the position for taking out the parts sent up to the parts feed position.

This constitution enhances the probability of sending out parts to the parts feed route by agitation of parts by increasing the number of times of air feed, and the probability of arrival of parts at parts feed position of the parts sent out to the parts feed route. Still more, the parts at the time of taking out the parts, by the air feed just before taking out the parts, the parts in the parts feed route can be securely and accurately sent out to the parts feed position, and can be immediately taking out directly in the specified direction and position by the suction nozzle or the like. Hence, the parts can be supplied more rapidly and stably than in the prior art.

In the invention, the air passage into the agitating chamber opens to the bottom of the agitating chamber, and there is also an auxiliary passage opened backward in the upper part of the front wall portion of the agitating chamber, said front wall portion being formed with an opening of the parts feed route.

In this constitution, the parts in the agitating chamber are agitated same as in the prior art by the air blowing up obliquely backward from the air passage opened in the bottom. In addition, by the air blowing out from the auxiliary passage above the front wall portion, the parts remaining stagnant in the upper space of the front wall portion are sufficiently agitated and diffused, and hence the probability of sending out the parts in specified direction into the parts feed route is enhanced, and it is also effective to avoid staying of parts in this space area to impede sending of parts to the parts feed route or jamming thereof. Hence, the parts can be supplied more quickly and stably than in the prior art.

According to an embodiment of the invention, in particular, the bottom of the parts feed position opened upward at the leading end of the parts feed route is formed higher than the bottom of the parts feed route at its downstream side.

In this constitution, the component sent up to the parts feed position is supported higher than the parts at the downstream side of the parts feed route, and by the height difference with the subsequent parts succeeding at the downstream side, only the component at the parts feed position can be easily taken out by the suction nozzle or the like. In addition, taking-out or suction of parts by suction nozzle may not have effects on the subsequent parts. Accordingly, multiple parts are sent out sequentially, promptly and securely to the parts feed position in a state to be easily taken out, and stably supplied into the mounting machine.

In the invention, a slope is provided between the bottom of the parts feed position and the bottom of the parts feed route at its downstream side.

By the slope of the constitution, the parts may be moved smoothly from the low bottom before the parts feed position of the parts feed route to the high bottom at the parts feed position, so that troubles due to step difference may not occur.

Further, a magnet is provided in the bottom of the parts feed position opened upward at the leading end of the parts feed route.

The magnet of the constitution magnetically attracts the magnetic parts sent up to the parts feed position, and holds in position, and therefore the parts sent up to the parts feed position may be held fixed in an adequate position or posture due to effects of air feed, vibration, or taking out or suction of preceding parts. Hence, the parts may be supplied quickly and stably.

In order to improve the function for sending the parts up to the parts feed position, an air groove of narrower width than the passage width of the parts feed route is formed in the central position in the longitudinal direction of at least one of the bottom and top of the parts feed route, said air groove extending through the parts feed route.

In this constitution, as the air pushes the parts while passing through the air groove, the parts are sent-up to the parts feed position, and parts in the parts feed route are more smoothly moved into the parts feed position so as to arrive at the parts feed position more accurately, thereby feeding the parts quickly and stably.

The invention is intended to simplify the air supply structure for blowing out air into parts, and the air supply means is branched from the common basic passage into the agitating chamber side air passage for supplying air into the agitating chamber, and the parts feed route side air passage for supplying air into the parts feed route within the main body of the apparatus, whereby air is supplied into the respective agitating chamber and parts feed route.

In this constitution, the piping structure necessary for supplying air into plural parts can be easily formed by making use of holes and grooves formed in parts of the apparatus main body by drilling or cutting, and the cost can be reduced.

In order to branch and supply air to parts appropriately, further comprises adjusting means for adjusting the branching amount of air from the basic passage to the agitating chamber side air passage and parts feed route side air passage.

In this constitution, the air branching amount from the basic passage to the agitating room side air passage and parts feed route side air passage can be adjusted by the adjusting means, and air supply to parts can be adjusted to an optimum state individually by the branch structure.

The invention is further intended to eliminate unexpected projection of parts at the parts feed position or change in posture or position, and comprises a shutter for opening and closing the upper opening part of the parts feed position in the parts feed route, wherein the shutter is closed at least when supplying air except for the time of taking out the parts.

In this constitution, projection of parts except when taking out the parts can be prevented. In particular, since the shutter is closed at least when supplying air except for the time of taking out the parts, it is effective to prevent projection of parts arriving at the parts feed position, or change of posture or position. The shutter is effective in the constitution in which an air groove is formed in the parts feed route and therefor air has a strong effect on the parts. In such a case, the shutter is useful for feeding the parts quickly and stably.

In an embodiment of the invention, in order to guarantee quick and stable feed of parts for a long period, the agitating chamber and parts feed route are formed of ceramic members detachably fitted to the apparatus main body.

In this constitution, by forming the agitating chamber and parts feed route of ceramic members, the agitating chamber and parts feed route are hardly worn, although frequently contacting with the parts, and quick and stable feed of parts can be guaranteed for a long period. Moreover, since only the necessary portions may be made of ceramic members which are detachable from the main body and therefor exchangeable, it is possible to prevent undue increase in manufacturing cost.

In order to reduce the manufacturing cost and running cost of using ceramic members, the ceramic members are divided into plural members.

In this constitution, since the ceramic members are divided into plural members, when the agitating chamber and parts feed route are complicated in shape or large in size, they can be formed partially, easily and inexpensively, and if broken and necessary to replace parts, they can be only partially replaced, and hence the running cost may be reduced.

The invention relates further to a parts feed method using a parts feed cassette for sending out part to the parts feed route while agitating by air, and further sending up to the parts feed position in the parts feed route while aligning the parts in neat order, wherein prior to start of feed of parts when feeding parts from the parts feed cassette to the mounting machine, air is preliminarily supplied to the parts feed cassette to align the parts in neat order to send up to the parts feed position in the parts feed route beforehand.

In this constitution, by supplying air preliminarily to the parts feed cassette prior to start of feed of parts, the parts can be sent up to the parts feed position in the parts feed route beforehand, while the succeeding parts can be put in neat order. In this state, parts feed is started and air is supplied for parts feed , so that the part can be supplied quickly, securely and stably.

Preliminary supply of air is effected as required depending on the parts feed cassette selected for use among plural cassettes.

In this constitution, wasteful preliminary supply of air is avoided. That is, air is supplied preliminarily only in specific parts feed cassettes when the parts are newly supplied due to shortage of parts, parts are changed due to changeover of production types, or supply of parts is unstable, so that quick, secure and stable feed of parts is guaranteed.

The invention is also intended to preliminarily supply air in the midway of the movement of the parts feed cassette from a waiting position to a working position where the mounting machine works.

In this constitution, air can be supplied preliminarily without taking extra time for the cycle of the parts feed at the working position, and by necessary and sufficient preliminary supply of air, the parts can be securely sent up to the parts feed position in the parts feed route in any case, while the succeeding parts can be securely arranged in neat order. Therefore, it is effective for supplying air preliminarily to all of plural parts feed cassettes by changeover of production types of parts.

Air is preliminarily supplied to the parts feed cassette at the working position where the mounting machine works.

In this constitution, when the parts feed cassette moves to the working position and the parts in the parts feed cassette return back by inertia, or parts are not sent up to the parts feed position due to fluctuations of the parts feed function by air supply, or in other cases of defective feed of parts, the parts can be securely sent preliminarily to the parts feed position. Moreover, the succeeding parts can be securely put in neat order, and arrival failure of parts at the time of parts feed can be prevented.

The invention further comprises a parts feed cassette for sending out parts to a parts feed route while agitating by air, and sending up to a parts feed position of the parts feed route while arranging them in neat order to feed up to a mounting machine, a moving table for picking up the parts feed cassette at waiting position and moving up to the working position by the mounting machine, a drive mechanism for moving this moving table, air supply means for supplying air to the parts feed cassette on the moving table at the working position, preliminary air supply means for supplying air to the parts feed cassette on the moving table at an intermediate position between the waiting position and working position, and control means for operating the air supply means and preliminary air supply means appropriately.

In this constitution, the parts feed cassette is put on the moving table at the waiting position, and when it is moved to the working position by the mounting machine, the control means actuates the air supply means, and air is supplied to the parts feed cassette at the parts feed position confronting the mounting machine. Therefore, the parts can be sent up to the parts feed position of the parts feed route same as in the prior art, and also the succeeding parts can be arranged in neat order, and the parts sent up to the parts feed position can be fed to the mounting machine.

In particular, when the moving table is at an intermediate position between the waiting position and working position, the control means actuates the preliminary air supply means, so that the air can be preliminarily supplied to the parts feed cassette, so that the parts feed method can be achieved automatically.

Besides, the control means can actuate the air supply means as required preliminarily prior to start of feed of parts at the working position, so that the parts feed method of the invention may be achieved automatically.

The invention also comprises air pressure adjusting means for adjusting the air pressure in the air supply route from the air supply source.

In this constitution, if there is fluctuation or difference in the air pressure supplied from the air supply source, it can be controlled to specific pressure depending on the type, size or shape of the parts by the air pressure adjusting means, and an appropriate air pressure is held for parts, and parts can be fed more stably by supply of air.

BRIEF DESCRIPTION OF THE DRAWINGS

FIG. 10 is an explanatory diagram showing a practical example of NC program;

EMBODIMENTS

Figure 1:
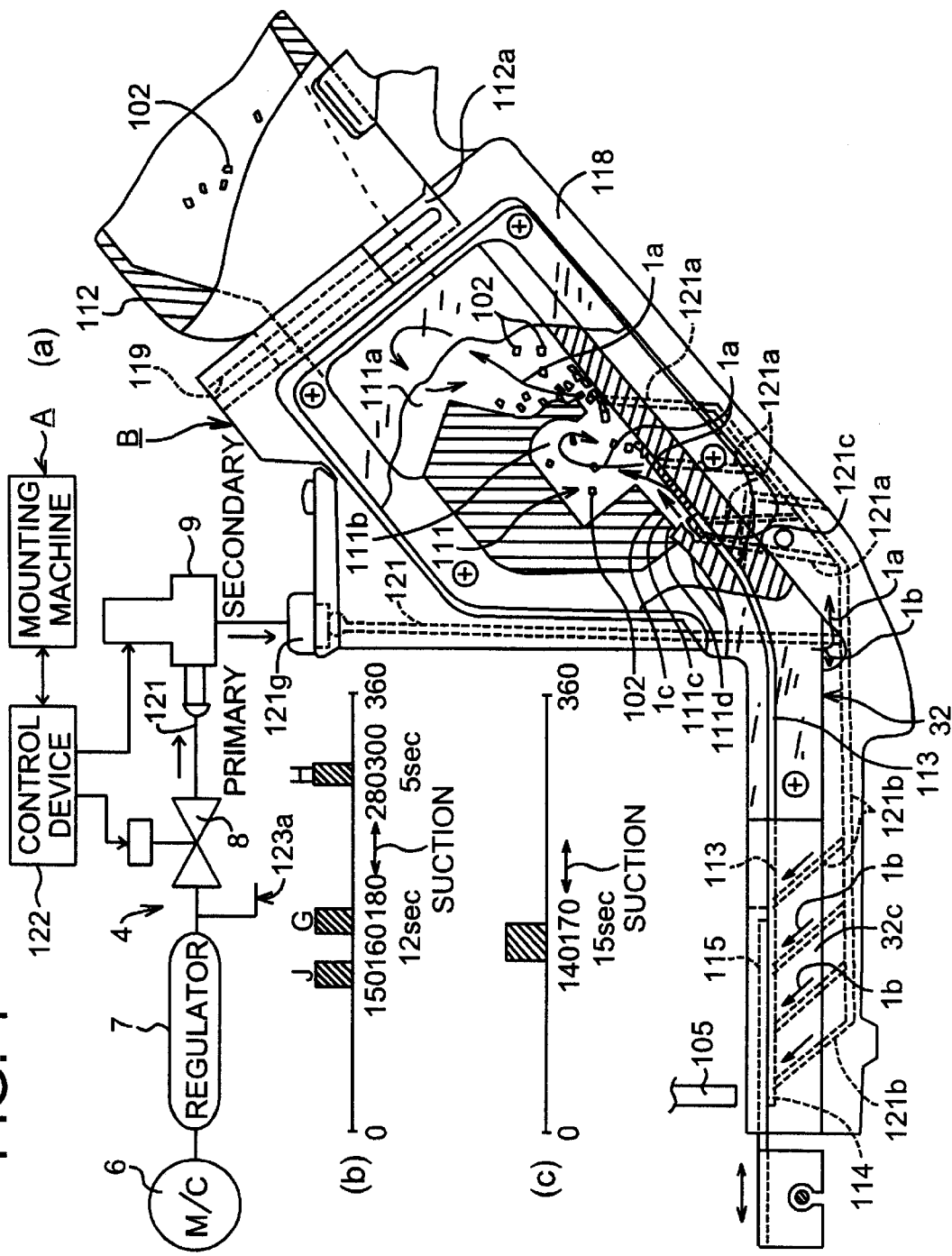
FIGS. 1a–c is a partial sectional view of a parts feed cassette of the invention, and a comparative time chart of air supply timing with the prior art.

Referring now to the drawings, the parts feed apparatus and parts feed method of the invention are described in embodiments.

Figure 2:
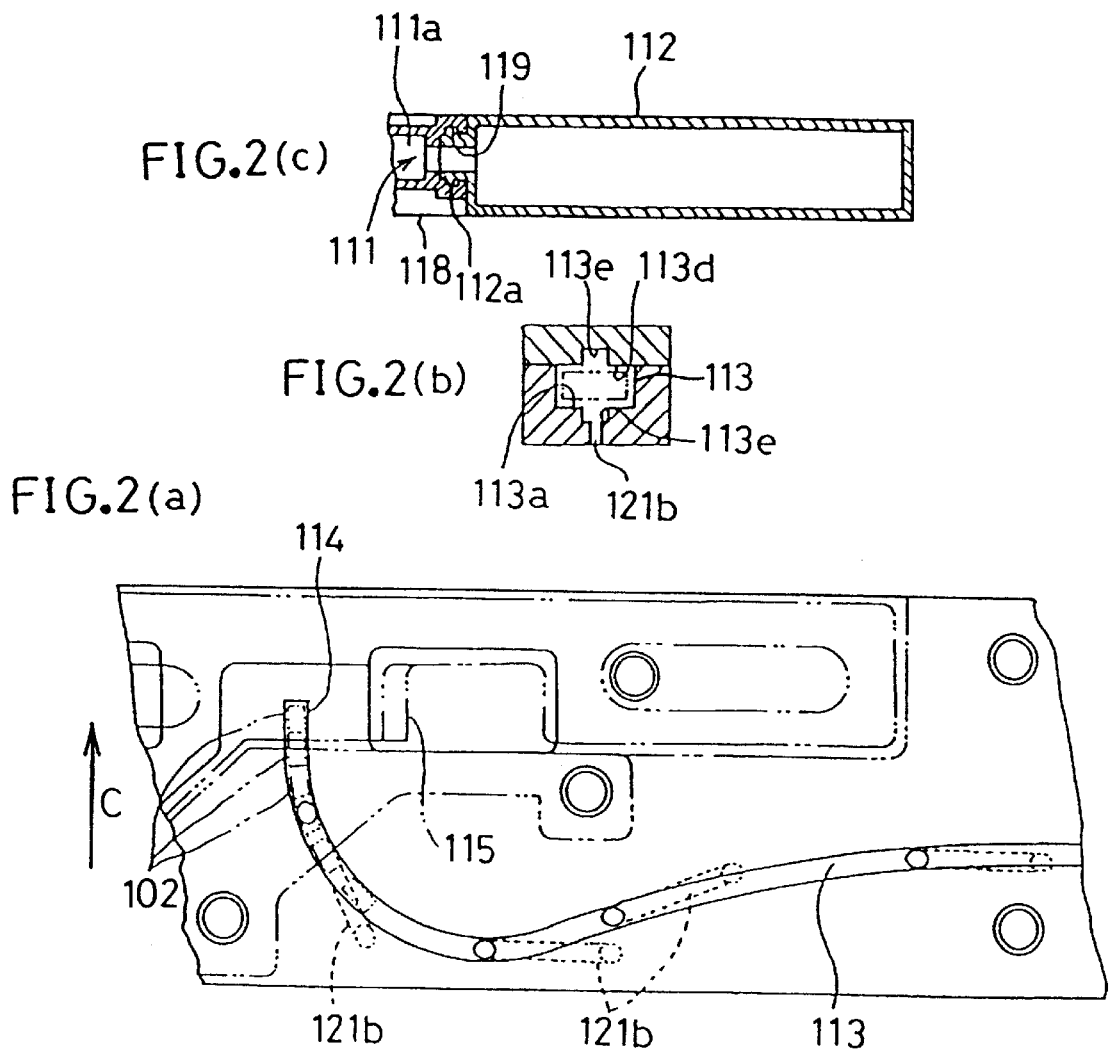
FIGS. 2(a)–(c) are a partial plan view and a partial sectional view of parts feed cassette.

A parts feed cassette B comprises, as shown in FIG. 1 (a) and FIG. 2 (a), an agitating chamber 111 for agitating parts 102 by air 1a, and a parts feed route 113 extending forward from the agitating chamber 111 for receiving those in specified direction out of the agitated parts 102 and sending up to a parts feed position 114 by air 1b. The parts feed cassette B is connected to air supply means 4 at production position E by a mounting machine A, and air 1a and 1b are blown out to the agitating chamber 111 and parts feed route 113.

As a result, while the parts 102 are agitated by the air 1a in the agitating chamber 111, the parts 102 in specified direction are sent out into the parts feed route 113, and are sent up to the parts feed position 114 by air 1b. The parts 102 are picked up by a suction nozzle 105, and carried forward and mounted on a printed board 101. The agitating chamber 111 is connected so that a bulk cassette 112 can be attached and detached as shown, for example, in FIG. 1 (a) or FIG. 2 (c), and is replenished with parts 102.

As shown in FIG. 1 (a), and FIG. 2 (c), an opening 112a of the bulk cassette 112 is fitted so as to be detached and attached from above in a dovetail groove 119 formed in a rear part of the agitating chamber 111 of a cassette main body 118. Thereby, as shown in FIG. 2 (c), the opening of the bulk cassette 112 and the agitating chamber 111 communicate with each other. By an inclined posture of the bulk cassette 112 at this time, or by an inverted posture not shown, the contained parts 102 naturally flow into the agitating chamber 111 to replenish.

The shape of the agitating chamber is not particularly defined, but the agitating chamber of the embodiment is formed so that the size becomes smaller in several steps sequentially from the rear side to which the bulk cassette 112 is connected toward the forward side linking with the parts feed route 113. The agitated parts 102 become smaller in quantity in the process of moving from the large rear agitating chamber 111a to the smallest agitating chamber 111c through an intermediate agitating chamber 111b, and are smoothly sent out to the parts feed route 113 from the smallest agitating chamber 111c.

As shown in FIG. 1, usually, the air passage 121a to the agitating chamber 111 is provided so that the air 1a may be blow up obliquely upward, slightly behind the bottom corresponding to the agitating chambers 111a to 111c. In this embodiment, there is also an auxiliary passage 121c opened backward in a front wall portion 111d in which the parts feed route 113 of the agitating chamber 111 is opened.

Accordingly, the parts 102 in the agitating chamber 111 are agitated same as in the prior art by the air blown up obliquely behind from the air passage 121a opened in the bottom. In addition, in the front wall portion 111d in which the parts feed route 113 of the agitating chamber 111 is opened where blown air did not reach in the prior art, air 1c is blown out from the auxiliary passage 121c opened behind, so that the parts 102 staying still in the front wall portion 111d can be sufficiently agitated and diffused. In consequence, the parts 102 are set in specified direction, and sent out into the parts feed route 113 at an increased probability, while avoiding escape of the parts from the parts feed route 113 or jamming due to staying of the parts 102 in the mentioned area, so that the parts 102 can be supplied more quickly and stably than in the prior art.

Figure 5:
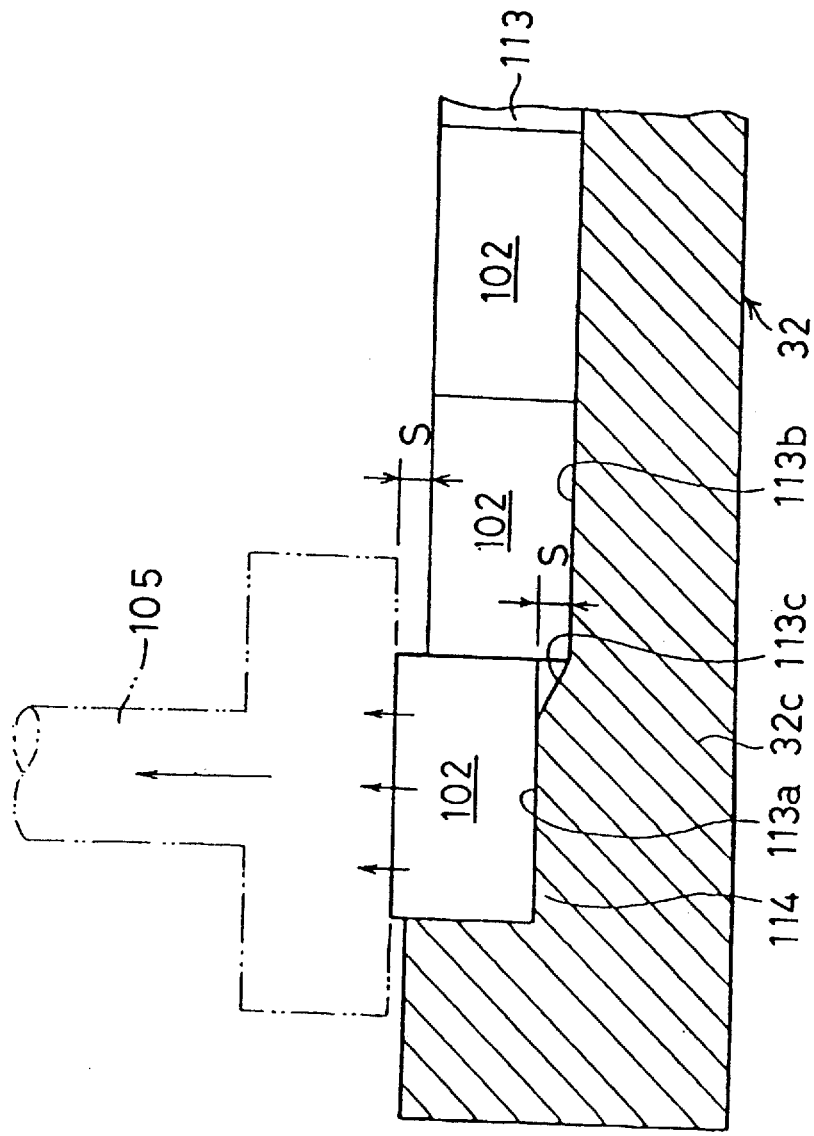
FIG. 5 is a partial sectional view of the parts feed cassette.

In the embodiment, moreover, the bottom 113a of the parts feed position 114 of the parts feed route 113 is set higher than the bottom 113b of the downstream side of the parts feed direction by step S as shown in FIG. 5, and a slope 113c is provided between the bottom 113a of the parts feed position 114 and the downstream side bottom 113b.

In this way, by setting the bottom 113a of the parts feed position 114 of the parts feed route 113 higher than the bottom 113b at the downstream side in the parts feed direction, the parts 102 arriving at the parts feed position 114 can be supported higher than the downstream side parts. Therefore, owing to the height difference by the step S from the subsequent parts 102 consecutive at the downstream side, only the parts 102 at the parts feed position 114 can be easily taken out individually by suction nozzle 105 or the like. Besides, the taking-out motion or suction may not affect the subsequent parts 102. Hence, multiple parts 102 can be stably supplied by sending sequentially to the parts feed position 114 quickly and securely.

Still more, if the bottom 113a at the parts feed position 114 is higher than the downstream side bottom 113b, the parts 102 can be smoothly moved from the low bottom 113b before the parts feed position 114 to the high bottom 113a of the parts feed position 114 by the slope 113c, so that trouble may not be caused by the step S.

Figure 4:
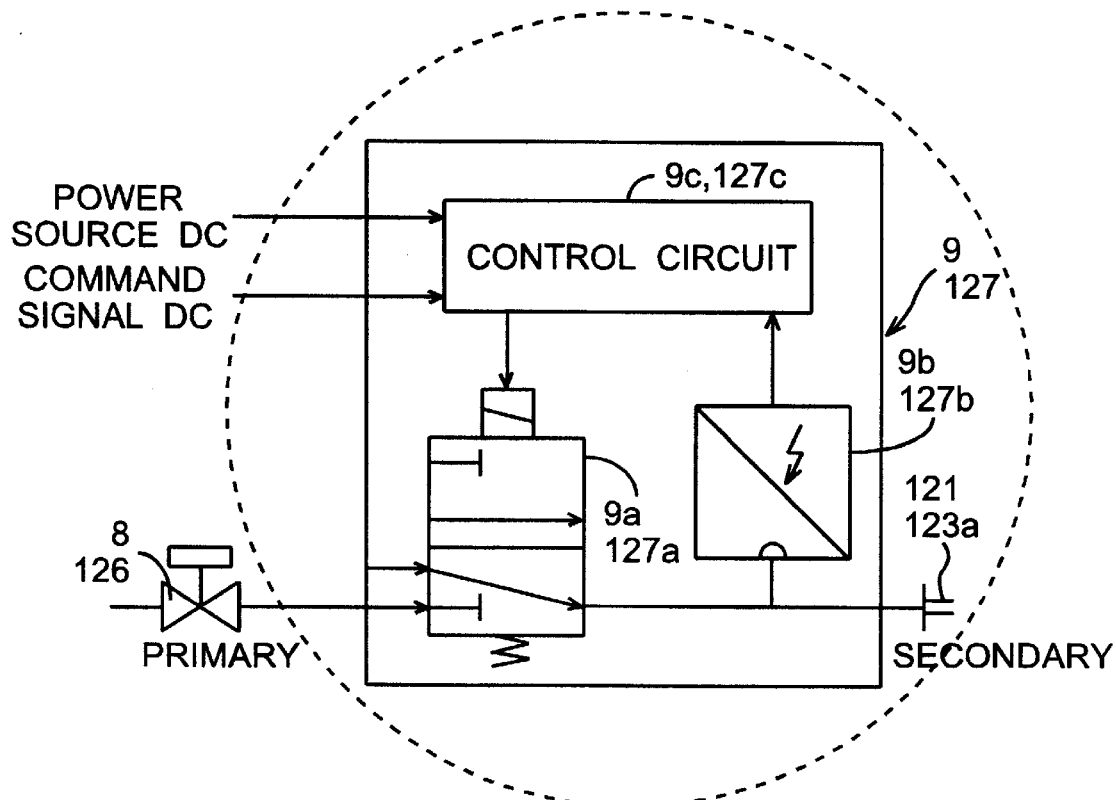
FIG. 4 is an outline structural diagram of an air pressure regulator.
Figure 6:
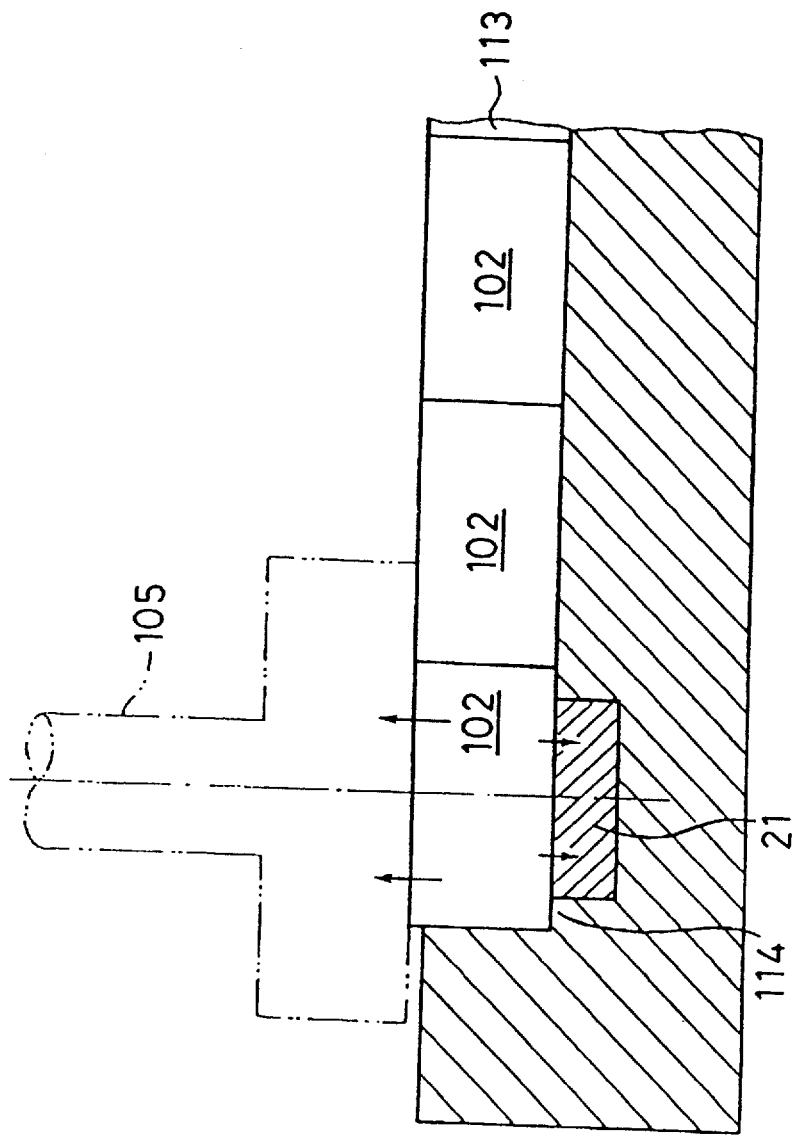
FIG. 6 is a partial sectional view of a parts feed cassette in other embodiment.

Instead of the embodiment, in a modified example shown in FIG. 6, a magnet 21 is attached to the bottom 3a of the parts feed position 114. In this constitution, the magnet 21 holds the position by attracting magnetic parts 102 sent to the parts feed position 114. Hence, the parts 102 sent up to the parts feed position 114 are not deviated from the proper position or posture due to effects of supply of air, vibration, or taking-out action or suction of preceding parts 102, so that it is helpful for presenting the parts 102 quickly and stably. Meanwhile, the magnet 21 in FIG. 6 and step S in FIG. 4 are combined, the both actions and effects are obtained simultaneously, which is more preferable.

Or, as shown in FIG. 2 (b), in the central position in the longitudinal direction in at least one of the bottoms 113a to 113c and top 113d of the parts feed route 113, an air groove 113e is formed from the front wall portion 111d to the parts feed position 114, in a smaller width than the passage width of the parts feed route 113 as shown in FIG. 2 so that parts 102 may not get in.

In this way, when the air groove 113e is formed in at least one of the bottom 113a and top 113d of the parts feed route 113, the air 1b passes through up to the parts feed position 114, and gets into the parts feed route 113 from the groove 113e, so that the parts 102 may be sent up to the parts feed position 114. By this air groove 113e, the parts 102 in the parts feed route 113 smoothly move up to the parts feed position 114. Moreover, the air groove 113e is helpful for sending the parts 102 securely into the parts feed position 114 and feeding the parts 102 quickly and stably. It is more effective when the air groove 113e is formed in both bottom 113a and top 113d.

As shown in FIG. 1 (a), the basic passage 121 of the air supply means 4 is branched within the cassette main body 118 into the agitating chamber side air passage 121a and auxiliary passage 121c for supplying air 1a, 1c into the agitating chamber 111, and the parts feed route side air passage 121b for supplying air 1b into the parts feed route 113, and air is supplied into the agitating chamber 111 and parts feed route 113. The piping structure necessary for supplying air 1a to 1c to plural sections is easily formed by drilling holes or cutting grooves in the cassette main body 118, and hence the cost can be reduced. when forming the grooves, by covering the grooves with seal member, an enclosed passage can be formed.

Moreover, in the parts feed position 114 opened upward at the leading end of the parts feed route 113, a conventional shutter 115 is provided as shown in FIG. 1 (a) and FIG. 2 (a), and the upper opening is designed to be opened and closed. This shutter 115 is controlled by a control device 122 so that it may be closed at least when supplying air, except for the period of taking out the parts, in particular.

The shutter 115 prevents unexpected projection of parts 102 except when taking out the parts, or changes of posture or position. That is, the shutter 115 prevents projection of parts 102 sent up to the parts feed position 114 by supplied air or changes in posture or position, especially when supplying air. As the air groove 113e is formed, and air has strong effects on the parts 102, the shutter 115 sufficiently copes with unexpected events, and help feed the parts 102 quickly and stably.

Figure 7:
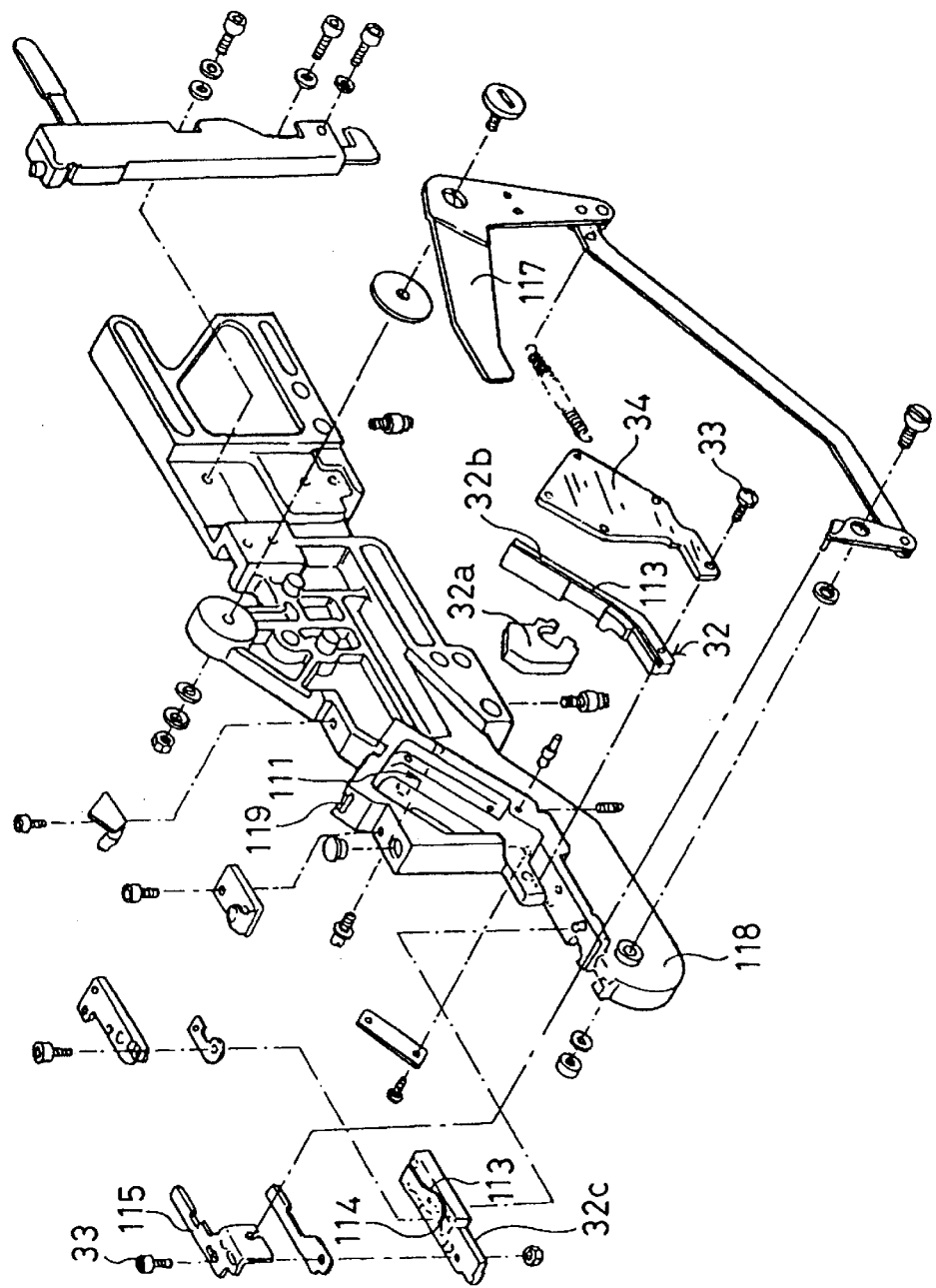
FIG. 7 is a perspective exploded view of the parts feed cassette.

Incidentally, the agitating chamber 111 and parts feed route 113 are fitted detachably to the cassette main body 118 by screw 33 and cover 34 as shown in FIG. 1 (a) and FIG. 7. The agitating chamber 111 and parts feed route 113 are fabricated of ceramic members 32, and are hardly worn, although contacting frequently with the parts 102, so that quick and stable feed of parts 102 may be guaranteed for a long period. Since the ceramic members 32 are detachably fitted to the cassette main body 118, only necessary portions may be made of ceramics, and fitted exchangeably, so that rise of manufacturing cost may be suppressed.

In particular, the ceramics 32 are divided into plural members, more specifically, into three sections, the agitating chamber section 32a, upstream side chute section 32b, and downstream side chute section 32c, and fixed by screws.

In this way, the ceramics 32, when complicated in shape, can be formed easily and inexpensively, and if broken, the sections can be replaced partially, so that the running cost may be reduced.

Figure 8:
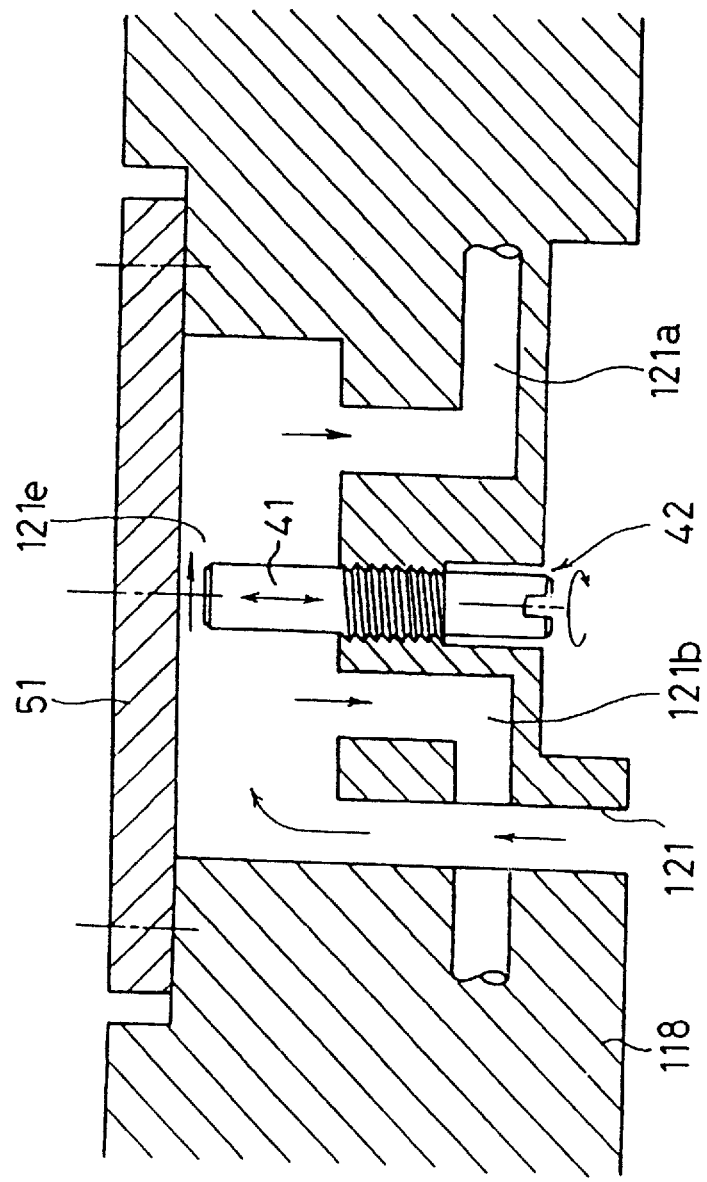
FIG. 8 is a sectional view of branching portion of air passage of the parts feed cassette.

In the branch in the cassette main body 118 from the basic passage 121 into the agitating chamber side air passage 121a and parts feed route side air passage 121b, as shown in FIG. 8, there is adjusting means 42 for adjusting the branching amount of the air into the agitating chamber side air passage 121a and parts feed route side air passage 121b by turning a screw 41 back and forth. By thus throttling the branch 121e by the adjusting means 52, supply of air to parts may be set in optimum state individually.

Figure 3:
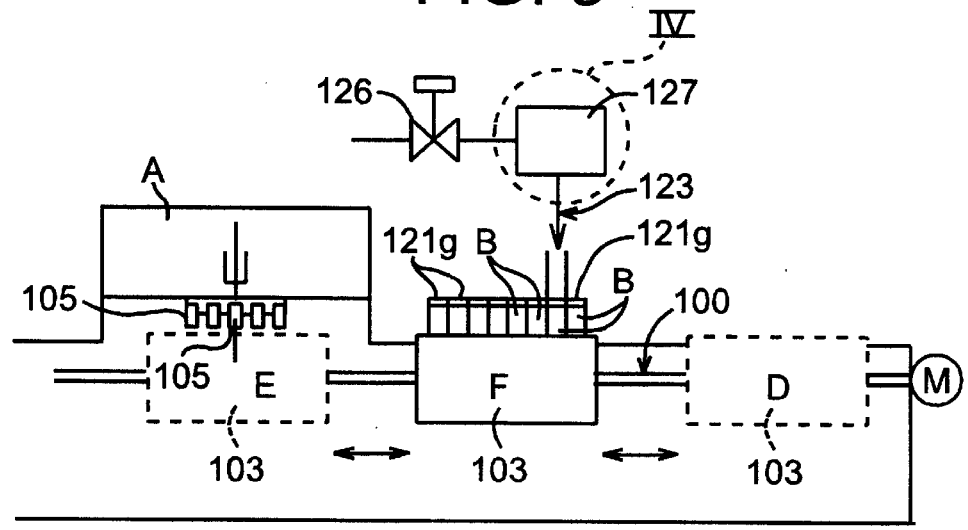
FIG. 3 is a schematic diagram of a parts feed apparatus.

Such parts feed apparatus for feeding parts to the mounting machine A by using the parts feed cassette B is structured as shown in FIG. 3. That is, the parts feed apparatus comprises a moving table 103 for moving between waiting position D for picking up the parts feed cassette B and production position N as working position by the objective mounting machine A, and a drive mechanism 100 composed of a screw shaft, servo motor having a rotary shaft to be engaged therewith, and others, for moving the moving table 103. In the parts feed apparatus, the air supply means 4 is provided at the production position E, and connected to an air supply port 121g at the production position E confronting the machine A, out of plural parts feed cassettes B on the moving table 103 located at this position, so that air may be supplied into the parts feed cassette B.

At an intermediate position F between the waiting position D and production position E, other preliminary air supply means 123 is provided, and is connected to a confronting air supply port 121g of the parts feed cassettes B on the moving table 103 at the intermediate position F, so that the air may be supplied preliminarily.

The drive mechanism 100 moves the moving table 103 between the waiting position D and production position E. Moreover, the drive mechanism 100 moves a specific one of the parts feed cassettes B on the moving table 101 at the production position E so as to confront the mounting machine A. The drive mechanism 100 also moves the moving table 103 at the intermediate position F, and moves a specific one of the parts feed cassettes B on the moving table 103 so as to confront the preliminary air supply means 123.

The moving table 103 picks up a necessary number of parts feed cassettes B at the waiting position D, or can replace with a necessary parts feed cassette B, or exchange the bulk cassette 112. Thus, the moving table 103 picks up parts feed cassettes B containing necessary parts, and moves to the production position E. When this moving table 103 confronts the mounting machine A, air is supplied into the parts feed cassette B at the parts feed position from the air supply means 4. The air supplied into the parts feed cassette B sends the parts 102 up to the parts feed position 114 of the parts feed route 113, and arranges the subsequent parts 102 in neat order.

The mounting machine A picks up the parts 102 supplied by the parts feed cassette B by the suction nozzle 105 provided in the parts mounting head 104, and places on specified positions of an electronic circuit board positioned by the mounting machine A. The mounting machine A is not limited to the apparatus for mounting electronic parts on the electronic circuit board. It may be any machine for assembling work or doing various jobs by using parts.

In this embodiment, in particular, when feeding parts 102 into the mounting machine A by using the parts feed cassette B, prior to start of parts feed, air is preliminarily supplied to the parts feed cassette B from the preliminary air supply means 123 or air supply means 4, and the parts are preliminarily sent up to the parts feed position 114 of the parts feed route in neat order.

When feeding parts into the parts feed cassette B for the first time after shortage of parts or production type changeover of parts, it takes a long time in feeding parts 102. Or, if not feeding parts for the first time, when the parts feed cassette B is moved to the production position E, the parts 102 being sent up to the parts feed position 114 of the parts feed route 113 may be slightly moved back and dislocated due to inertia, or the feed of parts 102 by air is unstable and they may not be sent up to the parts feed position 114. In such a case, upon start of parts feed, if air is supplied for a limited specific time only at the beginning for feeding parts 102, the parts 102 cannot be sent securely up to the parts feed position 114 in a short time. Accordingly, upon starting, parts feed, by preliminarily supplying air to the parts feed cassette B, the parts 102 can be sent up to the parts feed position 114 preliminarily without taking extra time in the job cycle for parts feed, while subsequent parts 102 can be arranged neatly. In this state, when parts feed is started and air is supplied for parts feed, the parts 102 preliminarily sent up to the parts feed position 114 of the parts feed route 113 are securely held at the parts feed position 114, and the subsequent parts 102 are also maintained in securely arranged state, so that the parts 102 may be fed quickly, securely, and stably.

Preliminary supply of air is effected as required for the selectively used parts feed cassette B. When the parts 102 are newly supplemented due to shortage of parts, or the parts 102 are changed due to production type changeover, or feed of parts 102 is unstable, only specific parts feed cassette B may be supplied, so that wasteful preliminary supply of air may be avoided, and quick, secure and stable feed of parts 102 may be achieved.

Moreover, at the intermediate position F in the process of the parts feed cassette B moving from the waiting position D to the production position E, when air is preliminarily supplied to the preliminary air supply means 123, preliminary supply of air is achieved without taking extra time for the cycle of parts feed at the production position E. By such necessary and sufficient preliminary supply of air, the parts 102 can be always sent up to the parts feed position 114 of parts feed route 113, and subsequent part 102 can be securely arranged neatly. Preliminary supply of air is useful for preliminary supply of air to all of plural parts feed cassettes B by production type changeover of parts 102.

Besides, preliminary air supply is effected by the air supply means 4 on the parts feed cassette B at the production position E. That is, after the parts feed cassette B has moved to the production position E, before start of feed of parts at the production position E, air is supplied preliminarily. Therefore, if the parts in the parts feed cassette B moving to the production position E are deviated from the parts feed position 114 of the parts feed route 113 by the inertia at the time of move of the parts feed cassette B, or the parts have not arrived yet at the parts feed position due to fluctuation of parts feed function by air, or in other defective feeding cases, the parts 102 can be securely sent preliminarily up to the parts feed position, and subsequent parts 102 may be arranged in neat order. Such preliminary supply of air is effective in the event of arrival failure of parts 102 at the time of parts feed.

The air supply means 4 and preliminary air supply means 123 supply air from a main compressor 6 as air supply source to the parts feed cassette B through one basic passage 121 in the cassette main body 118 through regulator 7, solenoid valves 8, 126, and air pressure regulators (Electropneumatic High-Reg of SMC) 9, 127 as air pressure regulating means. The air pressure regulator 9 stabilizes the air supply pressure and air feed rate as being set for blowing out air 1a, 1b. The solenoid valve 126 defines the preliminary supply timing of air and air supply duration by the preliminary air supply means 123. The air pressure regulator 127 stabilizes the air pressure and air flow rate for preliminary supply as being set by the preliminary air supply means 123.

Therefore, if the air pressure supplied from the main compressor 6 fluctuates or varies, it is controlled to a specified value by the air pressure regulator 9, and optimum conditions of air pressure and air flow for parts 102 are maintained, so that the parts 102 may be fed stably.

The air pressure regulator 9, 127 comprise, as shown in FIG. 4, solenoid valves 9a, 127a positioned somewhere in the air supply ducts from the solenoid valves 8, 126 to the basic passages 121, 123a, sensors 9b, 127b for detecting the pressure of secondary air at the downstream side of solenoid valves 9a, 127a and control circuits 9c, 127c to which these solenoid valves 9a, 127a and pressure sensors 9b, 127b are connected. The control circuits 9c, 127c receive a command signal from the control device 122 and detection signals from the pressure sensors 9b, 127b, and judges if the detection signals from the pressure sensors 9b, 127b are larger than or smaller than the command signal from the control device 122. Moreover, the control circuits 9c, 127c change over the solenoid valves 9a, 127a to the supply side and exhaust side, and hence even if the primary side air pressure fluctuates, the secondary side air pressure is kept constant, thereby controlling so that the pressure and amount of supply air to the parts feed cassette B may be always constant as being set. In the parts feed cassette B, only by controlling supply of air and stop of supply by opening and closing the solenoid valve 8, the parts 102 are supplied to the parts feed position 114 as being set. At this time, parts feed may be stabilized by supply of preliminary air as required. Also by controlling supply of air and stop of supply by opening and closing the solenoid valve 126, in the parts feed cassette B on the moving table 103 at the intermediate position F, by preliminary supply of air as required, the parts can be preliminarily sent up to the parts feed position 114 of the parts feed route 113, and subsequent parts 102 may be arranged, so that parts feed may be stabilized.

Or, as shown in FIG. 1 (b), the control device 122 controls so that the parts mounting action by the mounting machine A and the parts feed action by the parts feed cassette B may be mutually synchronized in a period of 0° to 360° as shown in FIG. 1 (b). The control device 122 simultaneously controls the solenoid valve 8.

In the control of solenoid valve 8 for parts feed, as shown in FIG. 1 (b), air supply for the parts feed is effected by opening and closing the solenoid valve 8 at time G and H before and after the parts 102 sent up to the parts feed position 114 are sucked and taken out by the suction nozzle 105, and preliminary air supply is effected as required at point J prior to air supply for parts feed. The solenoid valve 126 which is installed, together with the air pressure regulator 127, in the midst of the air supply route to the preliminary air supply means 123 is also controlled to be opened and closed for preliminary air supply on necessary point.

Thus, at the time G and H for parts feed, that is, before and after in a range of 180° to 280° shown in FIG. 1 (b), for example, if controlled to feed air 1a, 1b for 12 sec and 5 sec each, the parts 102 are taken out securely by the suction nozzle 105 without being affected by the air supply when taking out parts. Still more, by increasing the number of times of supply of air 1a, 1b, when the probability of sending out the parts 102 into the parts feed route 113 by agitation of parts 102 is enhanced, the probability of arrival of parts 102 sent out to the parts feed route 113 in the parts feed position 114 is heightened. Further, by supplying air just before taking out parts, the parts in the parts feed route 113 can be securely and accurately sent up to the parts feed position 114. In this state, instantly, the parts 102 are taken out in proper posture and position by the suction nozzle 105 and others, so that the parts 102 may be fed more quickly and stably than before.

Conventionally, as shown in FIG. 1 (c), it was designed to supply air 1a, 1b only once, for about 15 sec, at the timing in the range of 140° to 170°, further before the parts take-out time than in the embodiment. Hence, the action and effect as mentioned above by sharing of air with parts feed and preliminary air supply as in the embodiment could not be achieved.

Figure 9:
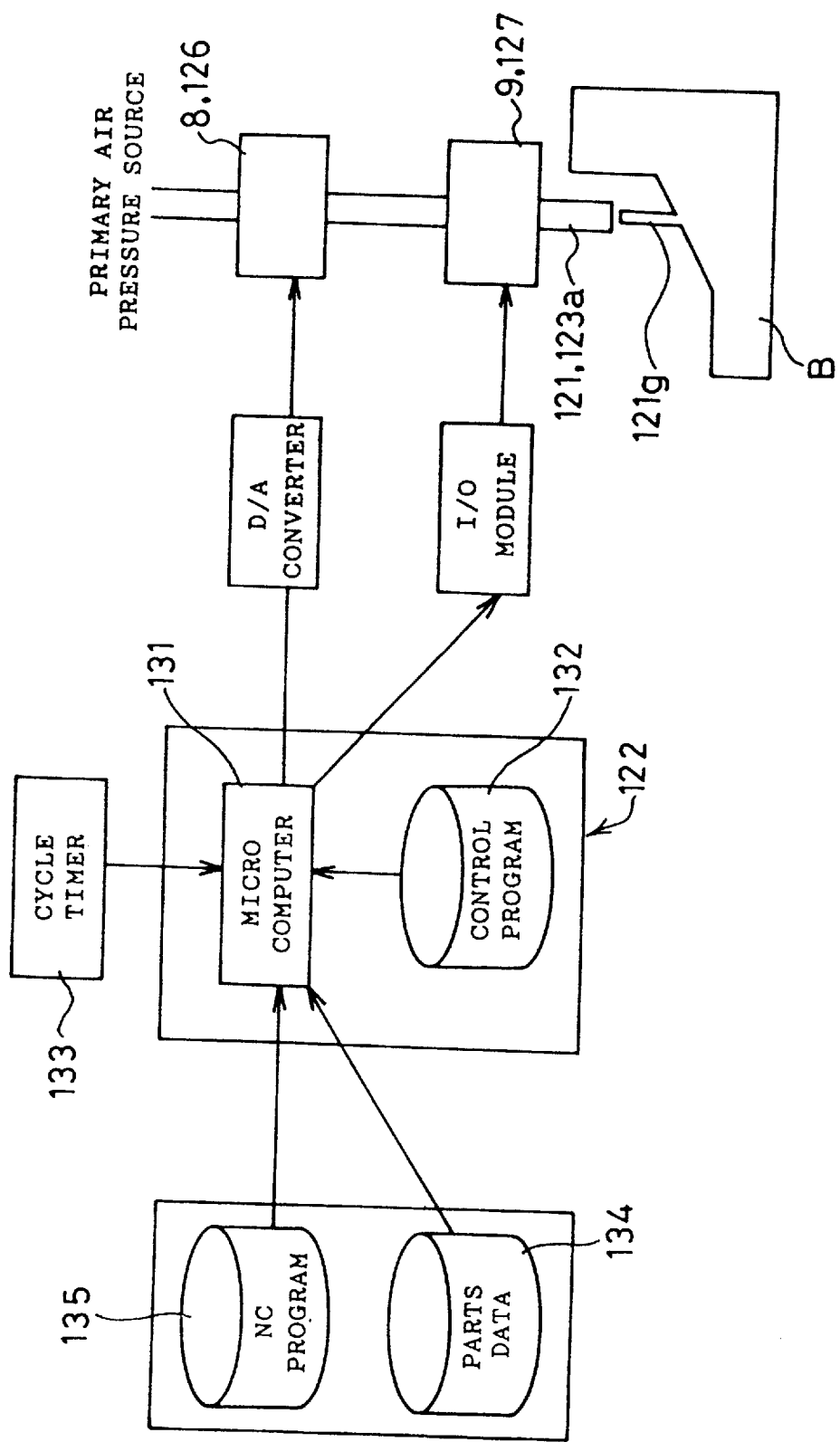
FIG. 9 is a block diagram of a control device of a parts feed apparatus.

The control device 122 is composed of, as shown in FIG. 9, a microcomputer 131, and a control program 132 for controlling various functions and operation of devices for mounting parts on electronic circuits. For this control, the microcomputer 131 always receives a cycle signal from a cycle timer 133 for controlling the operation cycle of the mounting machine A, and synchronizes the controls on the basis thereof. The cycle timer 133 is an absolute encoder for outputting the phase of a head shaft of a parts mounting head 104 in the mounting machine A.

Moreover, the microcomputer 131 receives the moving information of the moving table 103, and parts information such as type, shape, and size of the parts 102 to be fed, from parts data 134 relating to various parts 102 stored in the operation program of the mounting machine A, and data from the NC program 135 as the data of operation control, and controls the solenoid valves 8, 126, and air pressure regulators 9, 127, and sets optimally the timing and duration of air supply for parts feed and prior preliminary air supply, and also sets the air pressure of air supply optimally. The NC program 135 is, for example, as shown in FIG. 10, and data of Z indicates the moving direction of a specified one of the parts feed cassettes B on the moving table 103 to the parts feed position for next parts feed, and change from 1 to 2 means leftward moving of the moving table 103, and, as shown in FIG. 3, change from 2 to 1 means rightward moving of the moving table 101.

Figure 11:
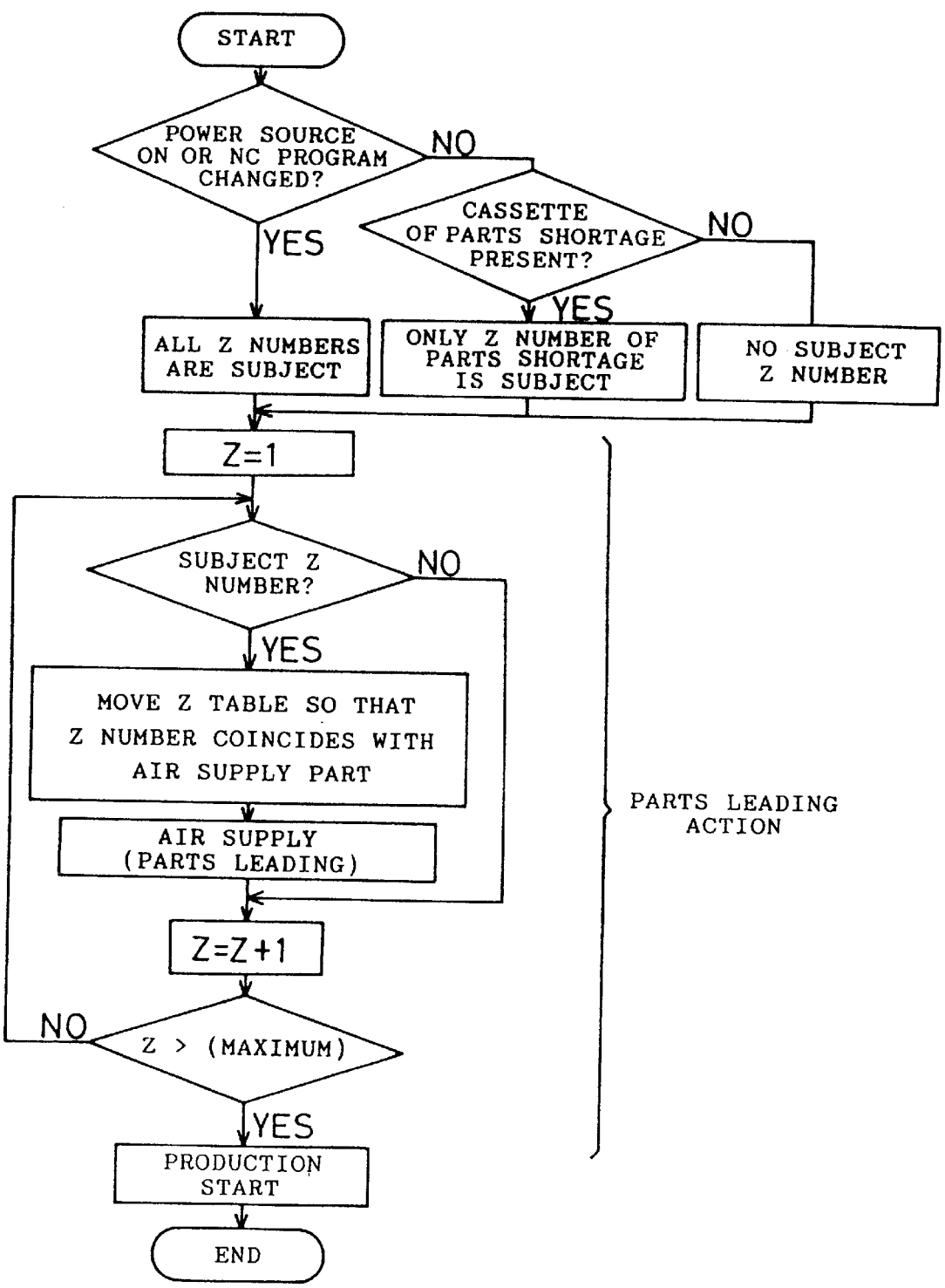
FIG. 11 is a flowchart of preliminary air supply to the parts feed cassette at an intermediate position of a moving table.
Figure 12:
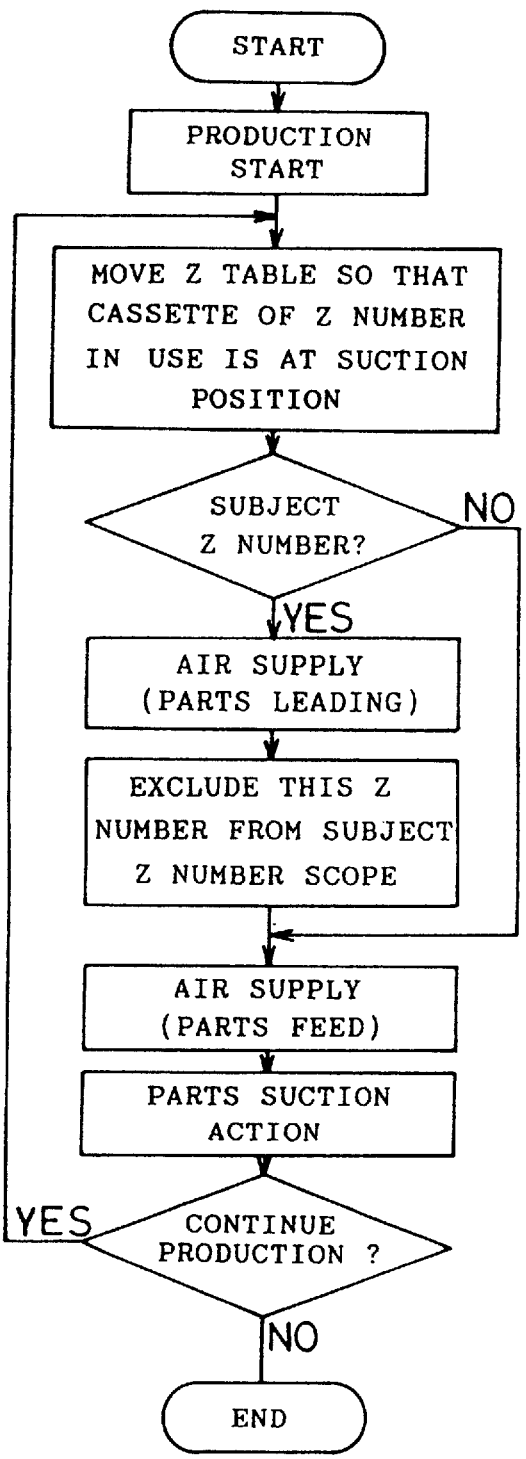
FIG. 12 is a flowchart of preliminary air supply to the parts feed cassette at a production position of the moving table.
Figure 13:
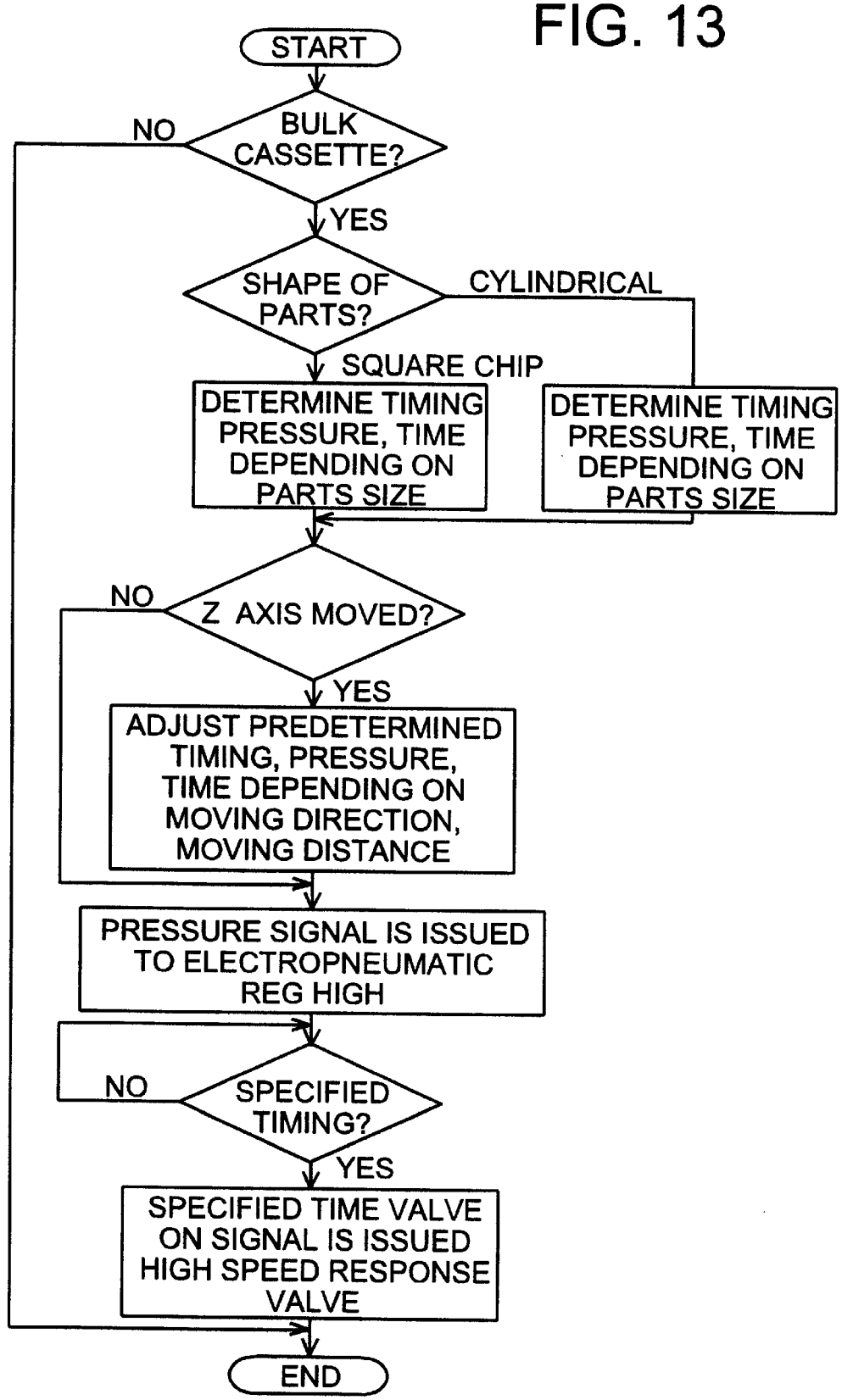
FIG. 13 is a flowchart of setting of timing, duration and air pressure of air supply.
Figure 14:
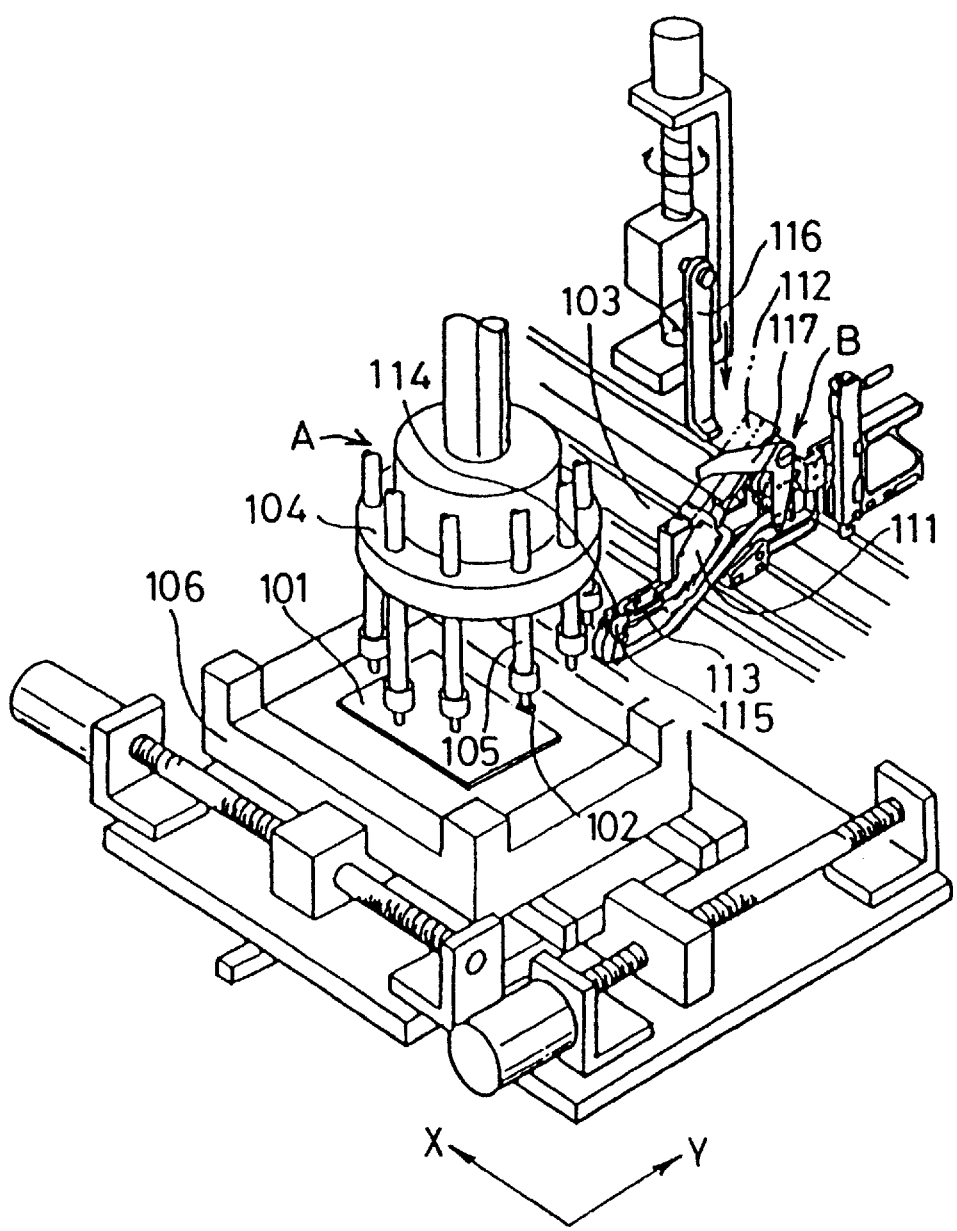
FIG. 14 is a perspective view of a parts feed apparatus.

FIG. 11 to FIG. 13 are flowcharts showing practical examples of the above control. In the diagrams, the moving table 103 is the Z table. FIG. 11 shows a practical example of so-called parts leading action by supplying air preliminarily from the preliminary air supply means 123 and positioning the parts 102 at the parts feed position of the parts feed route 113. When the power source is turned on, or change of NC program is judged, parts leading action is set on all parts feed cassettes B on the moving table 103. Each parts feed cassette B is provided with Z number, and requirement of parts leading action and finished state are controlled by the Z number. When parts leading action is effected on all parts, all Z numbers are specified.

When shortage of parts is detected, the Z number is specified for the parts feed cassette B with shortage of parts.

When neither is detected, parts leading action is not needed, and Z number is not specified.

After specifying Z number, parts leading action is effected. First, the Z numbers of parts feed cassettes B on the Z table are sequentially read out at intermediate position F, and it is judged if the parts feed cassette B requires parts leading action or not, and only the required parts feed cassette B, on every occasion, is moved to the position confronting the preliminary air supply means 123, and parts leading action is effected.

When such operation is finished on all parts feed cassettes B, the moving table 103 is moved to the production position E, and parts 102 are fed, and production is started.

FIG. 12 shows a practical example of parts leading action before start of parts feed by each parts feed cassette B on the Z table at the production position E. By the production start, the parts feed cassette B of the Z number used in parts feed is moved to the parts feed position confronting the mounting machine A.

Judging if the Z number of thus moved parts feed cassette B is subject to parts leading action or not, only if subjected, air is supplied preliminarily by the air supply means 4 to effects parts leading action, and the Z number of the parts feed cassette B having finished the parts leading action is excluded from the scope of parts leading action. This is the processing for not executing parts leading action in subsequent parts feed actions. If necessary, it can be effected every time.

After such processing, air is supplied to feed parts by the air supply means 4, and parts are fed by the parts feed cassette B at the parts feed position. Successively, by mounting parts by the mounting machine A, the above operation is repeated when continuing production, and production is terminated if necessary.

FIG. 13 shows a practical example of control for setting the air supply timing, duration and pressure. The program is progressed in the condition that the parts feed cassette B is bulk cassette, and first the shape of parts is judged. In the case of square chip parts or in the case of cylindrical parts, the air supply timing, duration, and pressure are set individually depending on the parts size.

Only when the Z table moves, the predetermined timing, duration and pressure are adjusted depending on the moving direction and moving distance.

Next, issuing a pressure signal to the pressure regulator, at specific timing, an ON signal for a specific time is issued to the solenoid valve, and air is supplied.

What is claimed is:

1. A parts feed apparatus comprising:
   an agitating chamber for agitating parts by air;
   a parts feed route connected to the agitating chamber for receiving agitated parts in a specific direction, arranging them in neat order, and sending them up to a specific parts feed position by air; and
   an air supply means for supplying air to the agitating chamber and parts feed route;
   wherein
   a bottom of the parts feed position opened upward at the leading end of the parts feed route is formed higher than the bottom of the parts feed route at its downstream side.

2. A parts feed apparatus as set forth in claim 1, wherein a slope is provided between the bottom of the parts feed position and the bottom of the parts feed route at its downstream side.

3. A parts feed apparatus as set forth in claim 1, wherein an air groove of a narrower width than the passage width of the parts feed route is formed in the central position in the longitudinal direction of at least one of the bottom and top of the parts feed route, said air groove extending through the parts feed route.

4. A parts feed apparatus as set forth in claim 1, wherein the air supply means is branched from a common basic passage into an agitating chamber side air passage for supplying air into the agitating chamber, and a parts feed route side air passage for supplying air into the parts feed route within a cassette main body, whereby air is supplied into the respective agitating chamber and parts feed route.

5. A parts feed apparatus as set forth in claim 4, further comprising an adjusting means for adjusting the branching amount of air from the basic passage to the agitating chamber side air passage and parts feed route side air passage.

6. A parts feed apparatus as set forth in claim 1, further comprising a shutter for opening and closing an upper opening part of the parts feed position in the parts feed route, wherein the shutter is closed at least when air is supplied excluding a time of taking out the parts.

7. A parts feed apparatus as set forth in claim 1, wherein the agitating chamber and parts feed route are formed of ceramic members detachably fitted to a cassette main body.

8. A parts feed apparatus as set forth in claim 7, wherein the ceramic members are divided into plural members.

9. A parts feed apparatus comprising:

an agitating chamber for agitating parts by air;

a parts feed route connected to the agitating chamber for receiving agitated parts in a specific direction, arranging them in neat order, and sending them up to a specific parts feed position by air; and an air supply means for supplying air to the agitating chamber and parts feed route;

wherein a magnet is provided in a bottom of the parts feed position opened upward at the leading end of the parts feed route.

10. A parts feed method using a parts feed cassette for sending out parts to a parts feed route while agitating the parts by air, comprising sending the parts to a parts feed position in the parts feed route while aligning the parts in neat order, wherein prior to start of feed of the parts when the parts are to be fed from the parts feed cassette to a mounting machine, air is preliminarily supplied to the parts feed cassette so that the parts are aligned in neat order and thereafter sent to the parts feed position in the parts feed route and then air is again supplied after the parts in the parts feed position have been taken out.

11. A parts feed method as set forth in claim 10, wherein the preliminary supply of air is effected as required depending on the parts feed cassette selected for use among plural cassettes.

12. A parts feed method as set forth in claim 10, wherein the preliminary supply of air is effected in a midway of movement of the parts feed cassette from a waiting position to a working position where the mounting machine works.

13. A parts feed method as set forth in claim 10, wherein air is preliminarily supplied to the parts feed cassette at the working position where the mounting machine works.

14. A parts feed apparatus comprising:

a parts feed cassette for sending out parts to a parts feed route while agitating them by air, and sending them up to a parts feed position of the parts feed route while arranging them in neat order to feed them up to a mounting machine;

a moving table for picking up the parts feed cassette at a waiting position and moving between the waiting position and a working position where a mounting machine works;

a drive mechanism for moving the moving table between the waiting position and working position;

an air supply means for supplying air to the parts feed cassette on the moving table at the working position;

a preliminary air supply means for supplying air to the parts feed cassette on the moving table at an intermediate position between the waiting position and working position; and a control means for operating the air supply means and preliminary air supply means appropriately.

15. A parts feed apparatus as set forth in claim 14, further comprising an air pressure adjusting means for adjusting air pressure in an air supply route from an air supply source.

16. A parts feed apparatus comprising:

an agitating chamber for agitating parts by air;

a parts feed route connected to the agitating chamber for receiving agitated parts in a specific direction, arranging them in neat order, and sending them up to a specific parts feed position by air;

an air supply means for supplying air to the agitating chamber and parts feed route; and a control means for controlling the air supply means so that, when the parts are being fed from a parts feed cassette to a mounting machine, air is preliminarily supplied to the parts feed cassette to send the parts aligned in neat order up to the parts feed position in the parts feed route before the parts are taken out, and air is again supplied after a part sent up to the parts feed position is taken out.

17. A parts feed apparatus as set forth in claim 16, wherein a parts feed route side air passage is provided so as to blow air in a direction to accelerate the speed of parts moving through the parts feed route.

18. A parts feed apparatus as set forth in claim 17, wherein a leading end of the parts feed route side air passage is inclined toward the parts feed position.

19. A parts feed apparatus as set forth in claim 17, wherein the parts feed route side air passage is disposed parallel to the parts feed route and said parts feed route side air passage is divided into plural branches, each leading end of which is inclined toward the parts feed position.

20. A parts feed apparatus as set forth in claim 16, wherein an air passage into the agitating chamber opens to a bottom portion of the agitating chamber, and an auxiliary passage opens backward in the upper part of a front wall portion of the agitating chamber, said front wall portion being formed with an opening of the parts feed route.

* * * * *